US011342432B2

(12) United States Patent
Lilak et al.

(10) Patent No.: US 11,342,432 B2
(45) Date of Patent: May 24, 2022

(54) GATE-ALL-AROUND INTEGRATED CIRCUIT STRUCTURES HAVING INSULATOR FIN ON INSULATOR SUBSTRATE

(71) Applicant: Intel Corporation, Santa Clara, CA (US)

(72) Inventors: Aaron D. Lilak, Beaverton, OR (US); Rishabh Mehandru, Portland, OR (US); Cory Weber, Hillsboro, OR (US); Willy Rachmady, Beaverton, OR (US); Varun Mishra, Hillsboro, OR (US)

(73) Assignee: Intel Corporation, Sabta Clara, CA (US)

( * ) Notice: Subject to any disclaimer, the term of this patent is extended or adjusted under 35 U.S.C. 154(b) by 0 days.

(21) Appl. No.: 16/833,184

(22) Filed: Mar. 27, 2020

(65) Prior Publication Data
US 2021/0305388 A1    Sep. 30, 2021

(51) Int. Cl.
*H01L 29/423*    (2006.01)
*H01L 21/02*    (2006.01)
(Continued)

(52) U.S. Cl.
CPC .... *H01L 29/42392* (2013.01); *H01L 21/0217* (2013.01); *H01L 21/02293* (2013.01);
(Continued)

(58) Field of Classification Search
CPC ......... H01L 21/02107; H01L 21/02164; H01L 21/0217; H01L 21/02225; H01L 21/0226;
(Continued)

(56) References Cited

U.S. PATENT DOCUMENTS 10,573,755 B1    2/2020  Frougier et al.
2014/0084370 A1*  3/2014  Cappellani ........ H01L 29/66795
                                               257/347
(Continued)

FOREIGN PATENT DOCUMENTS

WO  WO 2017/003411  1/2017
WO  WO 2017/052601  3/2017
WO  WO 2019/139572  7/2019

OTHER PUBLICATIONS

Search Report from European Patent Application No. 20216329.1, dated Jun. 7, 2021, 9 pgs.

*Primary Examiner* — Cheung Lee
(74) *Attorney, Agent, or Firm* — Schwabe, Williamson & Wyatt, P.C.

(57) ABSTRACT

Gate-all-around integrated circuit structures having an insulator fin on an insulator substrate, and methods of fabricating gate-all-around integrated circuit structures having an insulator fin on an insulator substrate, are described. For example, an integrated circuit structure includes an insulator fin on an insulator substrate. A vertical arrangement of horizontal semiconductor nanowires is over the insulator fin. A gate stack surrounds a channel region of the vertical arrangement of horizontal semiconductor nanowires, and the gate stack is overlying the insulator fin. A pair of epitaxial source or drain structures is at first and second ends of the vertical arrangement of horizontal semiconductor nanowires and at first and second ends of the insulator fin.

20 Claims, 13 Drawing Sheets

(51) Int. Cl.
*H01L 29/06* (2006.01)
*H01L 29/08* (2006.01)
*H01L 29/10* (2006.01)
*H01L 29/165* (2006.01)
*H01L 29/66* (2006.01)
*H01L 29/78* (2006.01)
*H01L 29/786* (2006.01)

(52) U.S. Cl.
CPC .... *H01L 21/02532* (2013.01); *H01L 29/0673* (2013.01); *H01L 29/0847* (2013.01); *H01L 29/1091* (2013.01); *H01L 29/165* (2013.01); *H01L 29/42368* (2013.01); *H01L 29/66545* (2013.01); *H01L 29/785* (2013.01); *H01L 29/78696* (2013.01)

(58) Field of Classification Search
CPC ......... H01L 21/02293; H01L 21/02518; H01L 21/02532; H01L 21/0259; H01L 21/02603; H01L 21/0262; H01L 21/823412; H01L 21/823431; H01L 21/8238; H01L 21/823807; H01L 21/823821; H01L 29/0665; H01L 29/0669; H01L 29/0673; H01L 29/0847; H01L 29/1091; H01L 29/165; H01L 29/4232; H01L 29/42368; H01L 29/42392; H01L 29/66545; H01L 29/775; H01L 29/785; H01L 29/7856; H01L 29/78696

See application file for complete search history.

(56) References Cited

U.S. PATENT DOCUMENTS

| | | | |
|---|---|---|---|
| 2017/0179299 A1* | 6/2017 | Bae | H01L 29/0673 |
| 2017/0186846 A1 | 6/2017 | Badaroglu | |
| 2019/0189806 A1* | 6/2019 | Leobandung | H01L 21/76224 |
| 2020/0066894 A1* | 2/2020 | Frougier | H01L 27/088 |
| 2020/0373391 A1* | 11/2020 | Yi | B82Y 10/00 |
| 2021/0028297 A1* | 1/2021 | Yao | H01L 21/30604 |

* cited by examiner

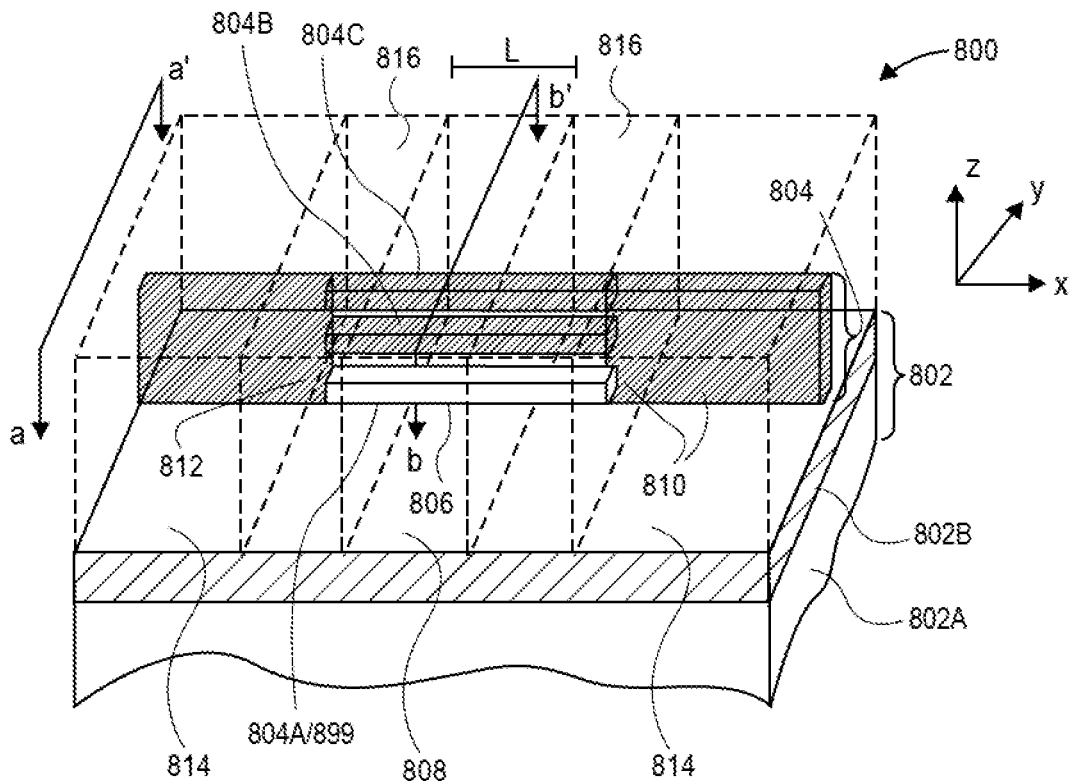
FIG. 8A
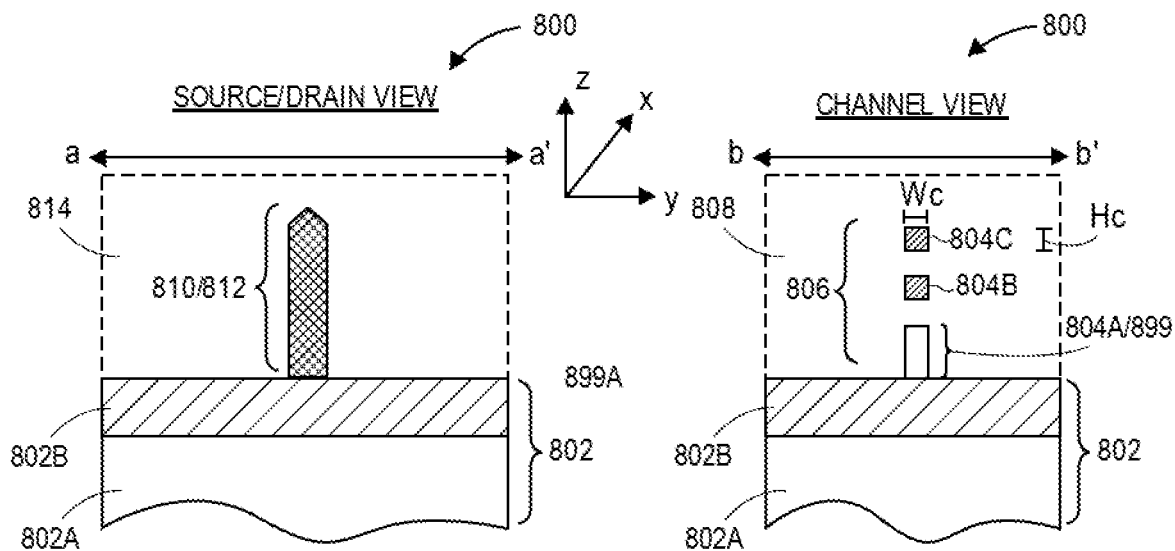
FIG. 8B  FIG. 8C

US 11,342,432 B2

GATE-ALL-AROUND INTEGRATED CIRCUIT STRUCTURES HAVING INSULATOR FIN ON INSULATOR SUBSTRATE

TECHNICAL FIELD

Embodiments of the disclosure are in the field of integrated circuit structures and processing and, in particular, gate-all-around integrated circuit structures having an insulator fin on an insulator substrate, and methods of fabricating gate-all-around integrated circuit structures having an insulator fin on an insulator substrate.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1A:
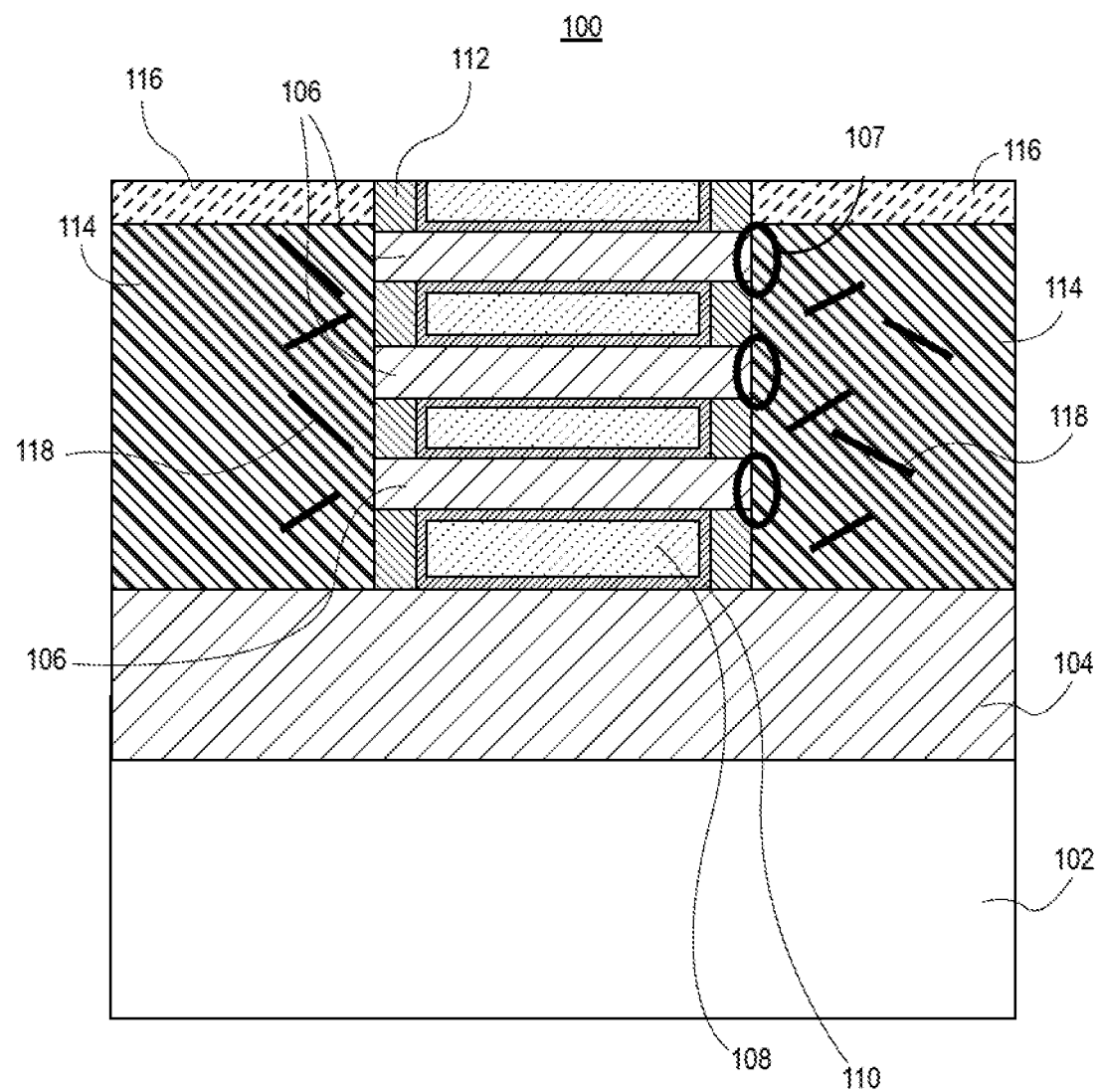
FIG. 1A illustrates a cross-sectional view of a gate-all-around integrated circuit structure on an insulator substrate.

Gate-all-around integrated circuit structures having an insulator fin on an insulator substrate, and methods of fabricating gate-all-around integrated circuit structures having an insulator fin on an insulator substrate, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to nanowire (NW) or nanoribbon (NR) devices formed on silicon on insulator (SOI) substrates with a removed (oxidized) body beneath a channel region and remaining body beneath source and drain regions to enable high-quality bottom-seeded epitaxial growth and eliminate a need for subfin doping isolation. Embodiments may be directed to isolation schemes for nanowire (NW) and/or nanoribbon (NR) transistors using insulator fins on insulator substrates. Embodiments may be implemented to provide a nanowire/nanoribbon transistor having reduced leakage. Embodiments with reference to a nanowire may encompass wires nanowires sized as wires or ribbons, unless specifically stated for nanowire-only dimensions.

To provide context, in state of the art gate-all-around (GAA) technology, the source/drain (S/D) junction can connect to substrate leading to an undesired high leaking path. State-of-the-art solutions for blocking or inhibiting source to drain leakage through semiconductor structures (such as subfin structures) beneath a nanowire device include subfin doping and/or physically increasing a gap between nanowires/nanoribbons and the underlying substrate structure. Both approaches, however, are associated with added process complexity.

Embodiments of the present disclosure may be implemented to provide for: (1) the use of a bottom-seeded epitaxial region in a source/drain of a NW/NR device formed on an SOI substrate or layer transferred substrate (such as GeOI, SiGeOI, III-VOI, etc.), (2) a NW/NR process which does not require a subfin isolation scheme, yet provides high channel strain and good quality epi S/D regions, and/or (3) selective depopulation of an SOI body beneath a gated region.

To provide further context, there are several integration approaches for forming NW/NR devices: (1) forming a NW/NR device on an SOI or layer transferred bulk substrate with an epitaxial region seeded laterally from channel stubs (e.g., as described below in association with FIG. 1A), and (2) forming a NW/NR device on a bulk or SOI substrate with an epitaxial region seeded from the substrate beneath and from channel stubs (e.g., as described below in association with FIG. 1B for a bulk substrate, and in association with FIG. 1C for an SOI or XOI substrate.

As a comparative example, FIG. 1A illustrates a cross-sectional view of a gate-all-around integrated circuit structure on an insulator substrate.

Referring to FIG. 1A, an integrated circuit structure 100 is on an insulator substrate 104/102, such as a substrate having an insulator layer 104 (such as silicon oxide) on a bulk semiconductor material 102 (such as crystalline silicon). A vertical arrangement of horizontal semiconductor nanowires 106 is over the insulator substrate 104/102. A gate stack surrounds a channel region of the vertical arrangement of horizontal semiconductor nanowires 106, the gate stack including a gate electrode 108 and a gate dielectric 110. The gate stack is on the insulator layer 104 of the insulator substrate 104/102. A gate spacer 112 is on either side of the gate stack. A pair of epitaxial source or drain structures 114 is at first and second ends of the vertical arrangement of horizontal semiconductor nanowires 106 and on the insulator layer 104 of the insulator substrate 104/102. Source or drain contacts 116 are on the pair of epitaxial source or drain structures 114. In one embodiment, the pair of epitaxial source or drain structures 114 includes defects 118.

Referring again to FIG. 1A, a NW/NR device can be fabricated with source/drain (S/D) epitaxial material (epi) seeded laterally from channel stubs (within circled regions 107). Seeding epi in this manner has been shown to produce defected/low-quality epi in the S/D. For simplicity, the epi shape in the S/D is shown generically, but it may be faceted/incompletely filled or voided/etc. Forming the device on an SOI substrate does, however, eliminate the need for a subfin doping solution to eliminate leakage current and to provide for CMOS isolation. Although, the poor quality epi grown in this and similar devices may not produce high channel stress needed for optimal device performance.

Figure 1B:
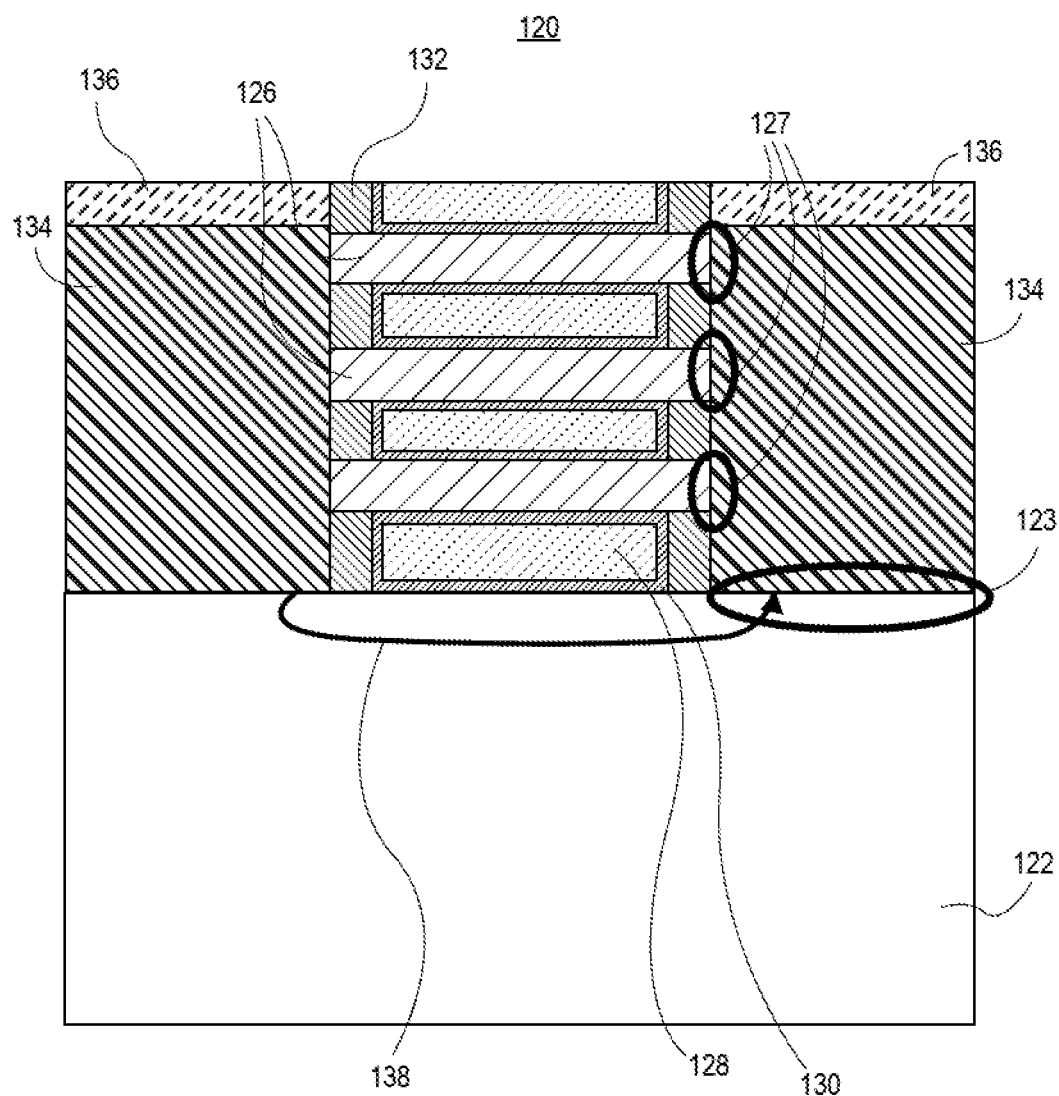
FIG. 1B illustrates a cross-sectional view of a gate-all-around integrated circuit structure on a semiconductor substrate.

As another comparative example, FIG. 1B illustrates a cross-sectional view of a gate-all-around integrated circuit structure on a semiconductor substrate.

Referring to FIG. 1B, an integrated circuit structure 120 is on a bulk semiconductor substrate 122 (such as a bulk crystalline silicon substrate). A vertical arrangement of horizontal semiconductor nanowires 126 is over the bulk semiconductor substrate 122. A gate stack surrounds a channel region of the vertical arrangement of horizontal semiconductor nanowires 126, the gate stack including a gate electrode 128 and a gate dielectric 130. The gate stack is on the bulk semiconductor substrate 122. A gate spacer 132 is on either side of the gate stack. A pair of epitaxial source or drain structures 134 is at first and second ends of the vertical arrangement of horizontal semiconductor nanowires 126 and on the bulk semiconductor substrate 122. Source or drain contacts 136 are on the pair of epitaxial source or drain structures 134.

Referring again to FIG. 1B, a NW/NR structure formed on a bulk substrate with S/D epi seeded largely from the horizontal exposed substrate 123 and less so from the channel stubs 127. This configuration of epi growth has been shown experimentally to produce a much higher-quality/less-defected epi region than the structure shown in FIG. 1A. The structure of FIG. 1B may, however, require a subfin isolation doping scheme to eliminate the subfin leakage paths (such as 138) and provide for CMOS isolation.

Figure 1C:
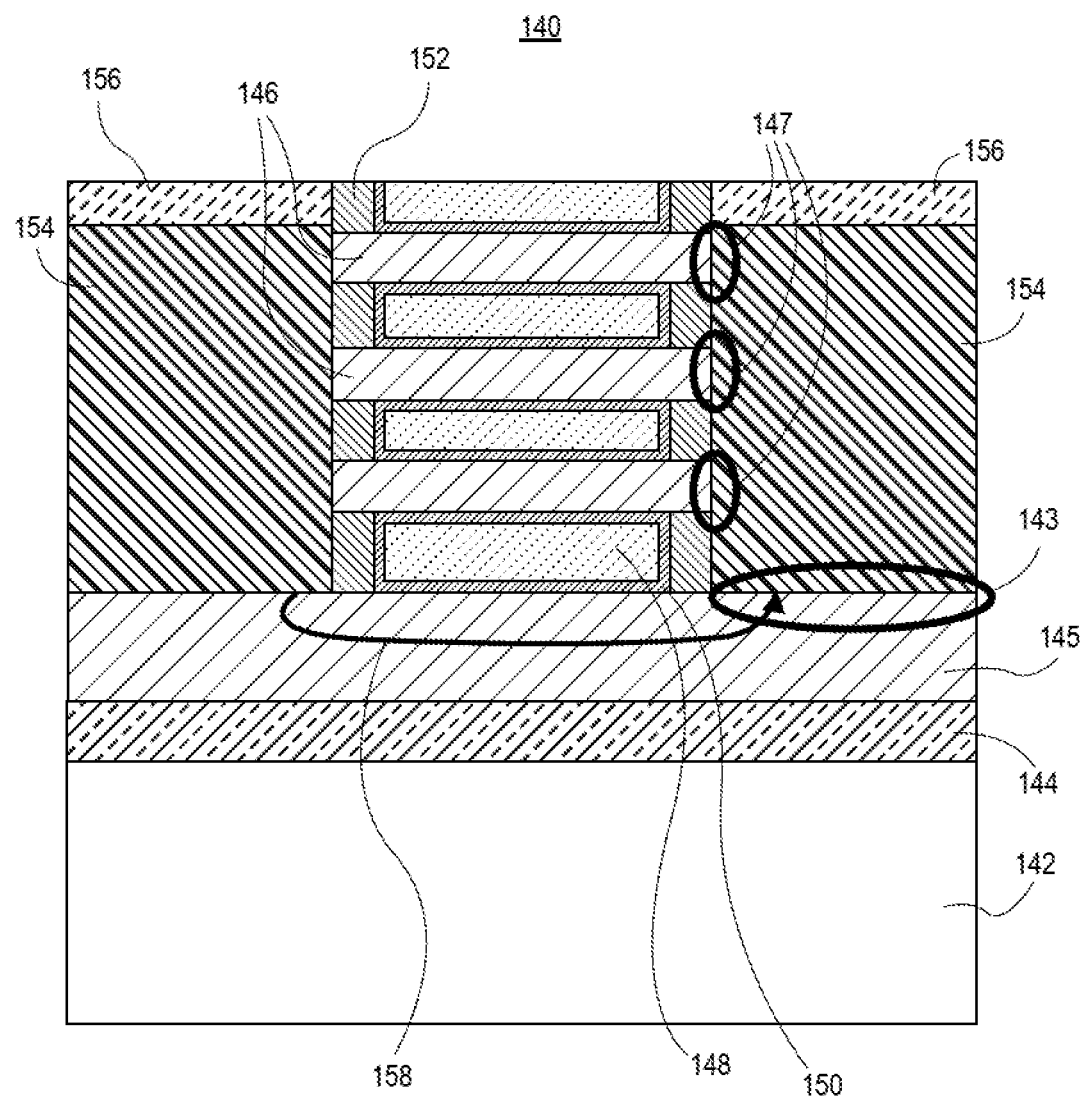
FIG. 1C illustrates a cross-sectional view of a gate-all-around integrated circuit structure on a semiconductor body on an insulator substrate.

As another comparative example, FIG. 1C illustrates a cross-sectional view of a gate-all-around integrated circuit structure on a semiconductor body on an insulator substrate.

Referring to FIG. 1C, an integrated circuit structure 140 is on a semiconductor body 145 (such as a silicon body) on a buried oxide layer 144 (such as a silicon oxide layer) on a bulk semiconductor material 142 (such as crystalline silicon). A vertical arrangement of horizontal semiconductor nanowires 146 is over the semiconductor body 145. A gate stack surrounds a channel region of the vertical arrangement of horizontal semiconductor nanowires 146, the gate stack including a gate electrode 148 and a gate dielectric 150. The gate stack is on the semiconductor body 145. A gate spacer 152 is on either side of the gate stack. A pair of epitaxial source or drain structures 154 is at first and second ends of the vertical arrangement of horizontal semiconductor nanowires 146 and on the semiconductor body 145. Source or drain contacts 156 are on the pair of epitaxial source or drain structures 154.

Referring again to FIG. 1C, similar structure to that of the structure of FIG. 1B, a state-of-the-art NW/NR device is fabricated on a SOI or XOI substrate with bottom-seeded epi (e.g., seeded largely from or entirely from the horizontal exposed substrate 143 and less so or not at all from the channel stubs 147). This structure also may require a subfin doping scheme to prevent leakage current (pathway 158) and provide for CMOS isolation.

Disadvantages of the structures of FIGS. 1A-1C include the tradeoff between channel strain and a need for a complicated subfin isolation solution. In many regards, a subfin isolation doping scheme for a NW/NR device is more complicated than that required for a finfet. Specifically, all of the NWs/NRs in same device may need to have the same nominal doping (and ideally be undoped for optimal mobility) so as to have the same electrostatics (i.e., one wire should not conduct before or after the other wires, and the Vt should be the same).

Providing further context, to prevent subfin conduction, doping of approximately $3E18/cm^3$ may be required beneath the gate in the substrate (bulk device) or body region (XOI device). To provide for highest mobility, the lowest NW/NR may be undoped (or effectively less than about $3E16/cm^3$). Such a doping gradient cannot be easily realized for a wide ribbon/wire via implant alone for greater than two wires spaced at about 10 nm apart. Rather, a complicated implant/dose-loss process may be required which will likely result in less optimal performance of the lower-most NW/NR. Embodiments described herein eliminate the need for such a complicated integration process and provides for high-quality epitaxial S/D growth.

Embodiments described herein may be implemented to include benefits or advantages from each of the approaches described in association with FIGS. 1A-1C to provide a device structure based on a bottom-seeded epi fabricated from an SOI/XOI body, with the channel region body material "removed from" (oxidized) beneath the channel. The process may eliminate the need for a subfin isolation process. Advantages to implementing embodiments described herein include providing for high channel stress (through less-defected, higher-quality epi) and eliminating the need for a subfin isolation scheme on a NW/NR device. Value can be realized as a higher-performing device (higher channel strain), and a less costly/easier integration (no need for subfin isolation). Processes described herein integrates well with non-Si NW/NR structures (which are potentially much easier to integrate from a XOI or layer-transferred substrate).

In accordance with an embodiment of the present disclosure, regarding detectability in a final product, integrated circuit structure described herein can differ from state-of-the-art NW/NR structures in regard to the "depopulated" body region beneath the channel and remnant body region beneath the S/D of the device. Structures can be formed on an SOI/XOI substrate with the body region selectively depopulated beneath the gate of the device.

Figure 2A:
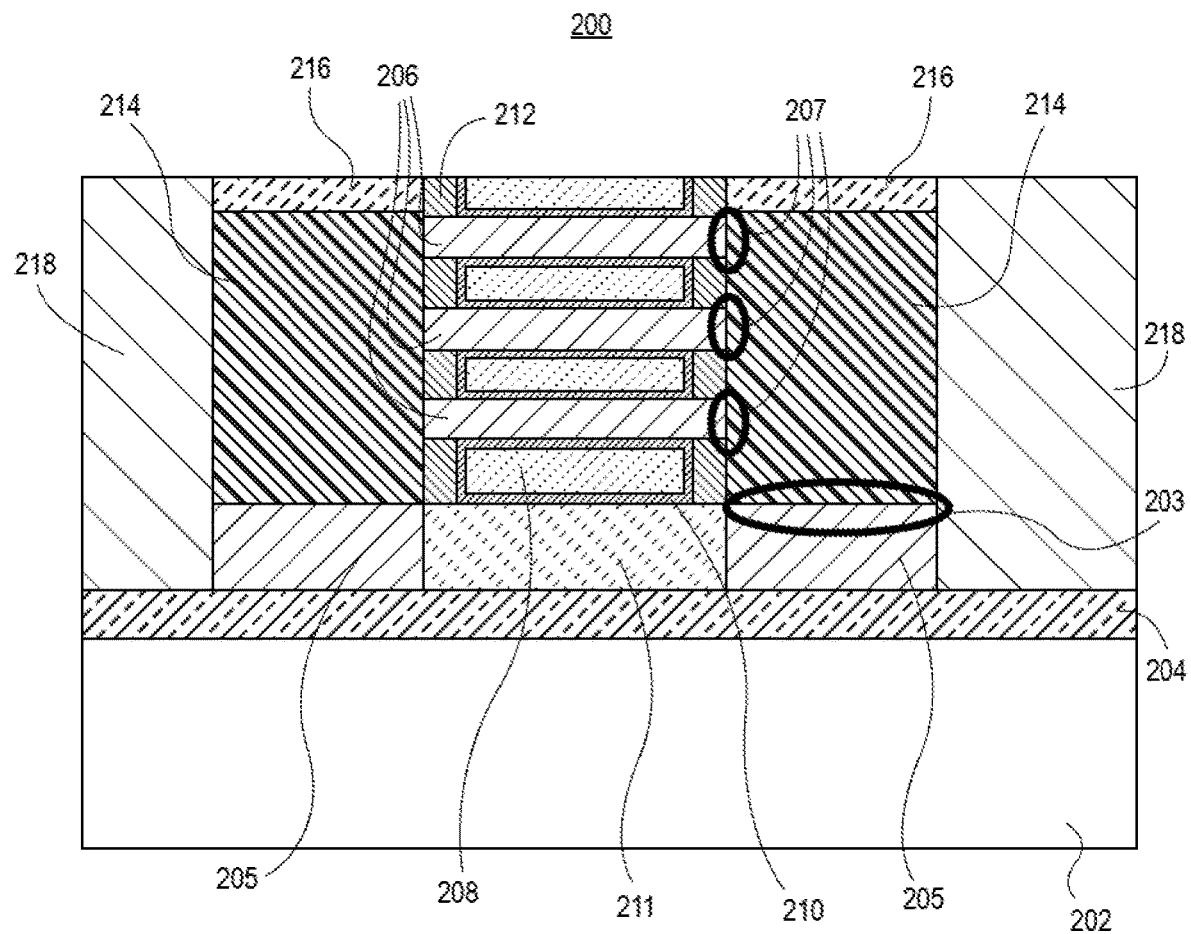
FIG. 2A illustrates a cross-sectional view of a gate-all-around integrated circuit structure having an insulator fin on an insulator substrate, in accordance with an embodiment of the present disclosure.

As an exemplary device having an insulator fin on an insulator substrate, FIG. 2A illustrates a cross-sectional view of a gate-all-around integrated circuit structure having an insulator fin on an insulator substrate, in accordance with an embodiment of the present disclosure.

Referring to FIG. 2A, an integrated circuit structure 200 is in a dielectric layer 218 on an insulator fin 211 on an insulator substrate 204/202, such as a substrate having an insulator layer 204 (such as silicon oxide) on a bulk semiconductor material 202 (such as crystalline silicon). A vertical arrangement of horizontal semiconductor nanowires 206 is over the insulator fin 211. A gate stack surrounds a channel region of the vertical arrangement of horizontal semiconductor nanowires 206, the gate stack including a gate electrode 208 and a gate dielectric 210. The gate stack is also overlying the insulator fin 211. A gate spacer 212 is on either side of the gate stack. A pair of epitaxial source or drain structures 214 is at first and second ends of the vertical arrangement of horizontal semiconductor nanowires 206. In one embodiment, the pair of epitaxial source or drain structures 214 is on corresponding lower source or drain portions 205 at first and second ends of the insulator fin 211. Thus, source or drain structures for integrated circuit structure 200 may be formed as epitaxial source or drain structures 214 together with lower source or drain portions 205. Source or drain contacts 216 are on the pair of epitaxial source or drain structures 214.

Referring again to FIG. 2A, epi is seeded from a crystalline body of an SOI/XOI layer at surface 203 (as opposed to being seeded from channel stubs 207). In one embodiment, the body region is oxidized beneath the channel of the device which eliminates the need for subfin isolation doping (i.e., the oxidized body provides for isolation).

Figure 2B:
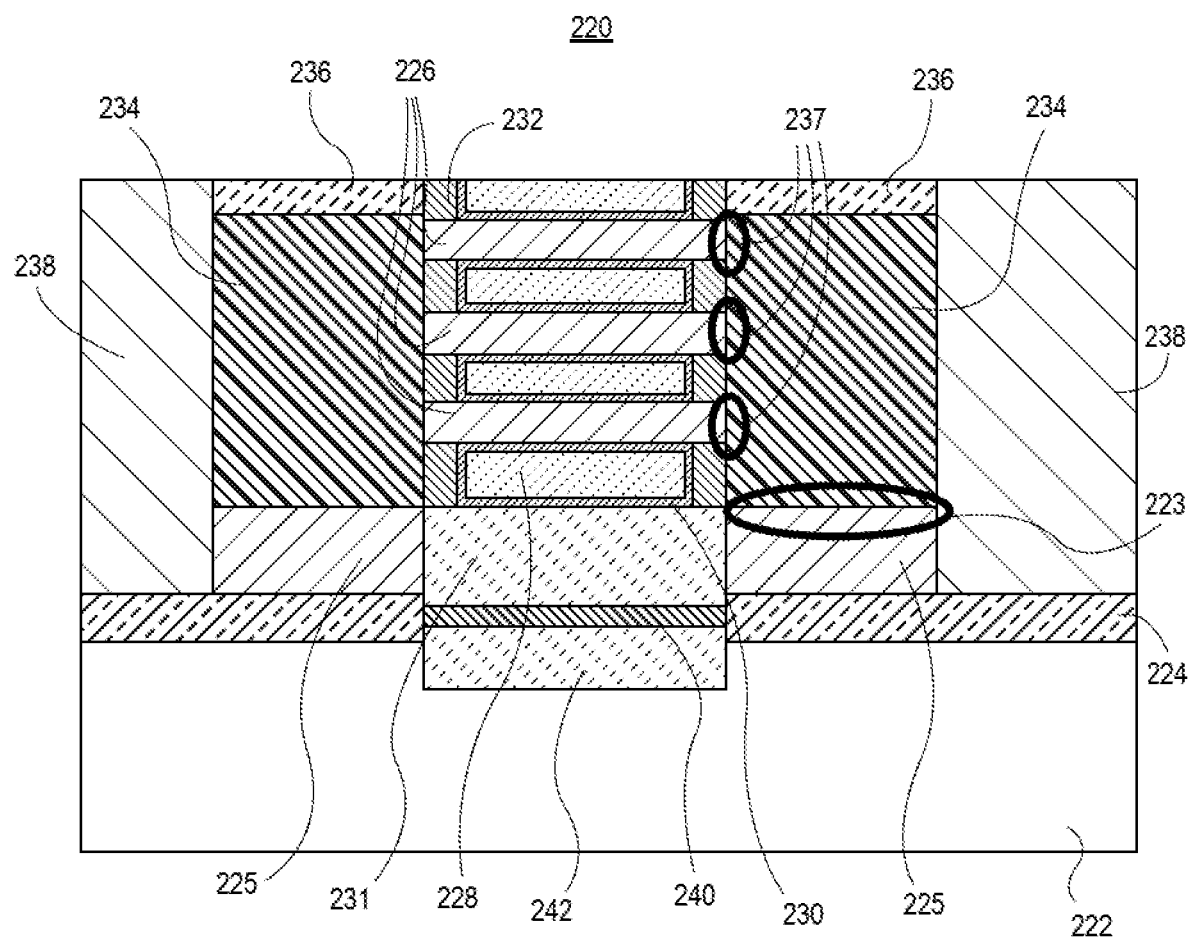
FIG. 2B illustrates a cross-sectional view of another gate-all-around integrated circuit structure having an insulator fin on an insulator substrate, in accordance with another embodiment of the present disclosure.

As another exemplary device having an insulator fin on an insulator substrate, FIG. 2B illustrates a cross-sectional view of another gate-all-around integrated circuit structure having an insulator fin on an insulator substrate, in accordance with another embodiment of the present disclosure.

Referring to FIG. 2B, an integrated circuit structure 220 is in a dielectric layer 238 on an insulator fin 231 on an insulator substrate 224/222, such as a substrate having an insulator layer 224 (such as silicon oxide) on a bulk semiconductor material 222 (such as crystalline silicon). A vertical arrangement of horizontal semiconductor nanowires 226 is over the insulator fin 231. A gate stack surrounds a channel region of the vertical arrangement of horizontal semiconductor nanowires 226, the gate stack including a gate electrode 228 and a gate dielectric 230. The gate stack is also overlying the insulator fin 231. A gate spacer 232 is on either side of the gate stack. A pair of epitaxial source or drain structures 234 is at first and second ends of the vertical arrangement of horizontal semiconductor nanowires 226. In one embodiment, the pair of epitaxial source or drain structures 234 is on corresponding lower source or drain portions 225 at first and second ends of the insulator fin 231. Thus, source or drain structures for integrated circuit structure 220 may be formed as epitaxial source or drain structures 234 together with lower source or drain portions 225. Source or drain contacts 236 are on the pair of epitaxial source or drain structures 234.

Referring again to FIG. 2B, referring again to FIG. 2B, epi is seeded from a crystalline body at surface 223 (as opposed to being seeded from channel stubs 237). A body region is oxidized with a catalytic oxidant (catox) material from both above and below to form insulator fin 231. In one such embodiment, the process may also result in a region of the substrate also being oxidized to form oxidized substrate portion 242. A remnant region 240 of the catalytic oxidant source may also exist in this region. In one embodiment, the catalytic oxidant source is alumina (AlOx).

With reference to a process flow for fabricating the structures of FIGS. 2A and 2B, in accordance with an embodiment of the present disclosure, a method of fabricating an integrated circuit structure includes forming a vertical arrangement of horizontal semiconductor nanowires above a semiconductor fin above an insulator substrate. A dummy gate stack is then formed, the dummy gate stack surrounding a channel region of the vertical arrangement of horizontal semiconductor nanowires, and the dummy gate stack overlying the semiconductor fin. A pair of epitaxial source or drain structures is formed at first and second ends of the vertical arrangement of horizontal semiconductor nanowires and at first and second ends of the semiconductor fin. The dummy gate stack is then removed. The semiconductor fin is then oxidized to form an insulator fin. A permanent gate stack is then formed, the permanent gate stack surrounding the channel region of the vertical arrangement of horizontal semiconductor nanowires, and the permanent gate stack overlying the insulator fin.

In an embodiment, the semiconductor fin oxidized to form the insulator fin using catalytic oxidation within a gate tub formed upon removal of the dummy gate stack. In one embodiment, alumina (AlOx) is used as a catalytic oxidant. The catalytic oxidant is deposited in the gate tub and then recessed to be confined to a subfin structure or lowest nanowire. The subfin structure or lowest nanowire is then oxidized using the catalytic oxidant which may layer be removed or retained. In an alternative embodiment, a helmeted process is used to enable wet etch of an underlying semiconductor body.

Further advantages for implementing embodiments described herein include the ability to fabricate a robust transistor structure for a low power product or application. In some embodiments, a starting Si thickness in the SOI substrate is either the same as or different from the overlying nanowire or nanoribbon channel Si thickness. In some embodiments, the channel material is Si of is different than Si such as SiGe or group III-V materials. In some embodiments, the insulator material is silicon oxide or is different from silicon oxide, such as silicon nitride. In some embodiments, a source or drain structure lands on the top surface of the insulator substrate.

Figure 3A:
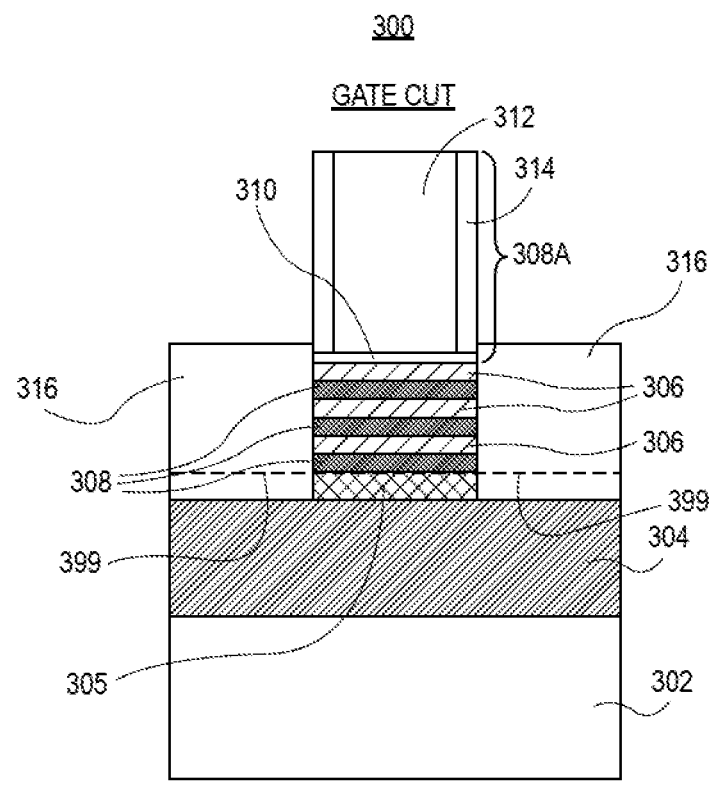
FIGS. 3A and 3B illustrate a gate cut cross-sectional view and a fin cut cross-sectional view, respectively, of a gate-all-around integrated circuit structure having an insulator fin on an insulator substrate, in accordance with an embodiment of the present disclosure.
Figure 3B:
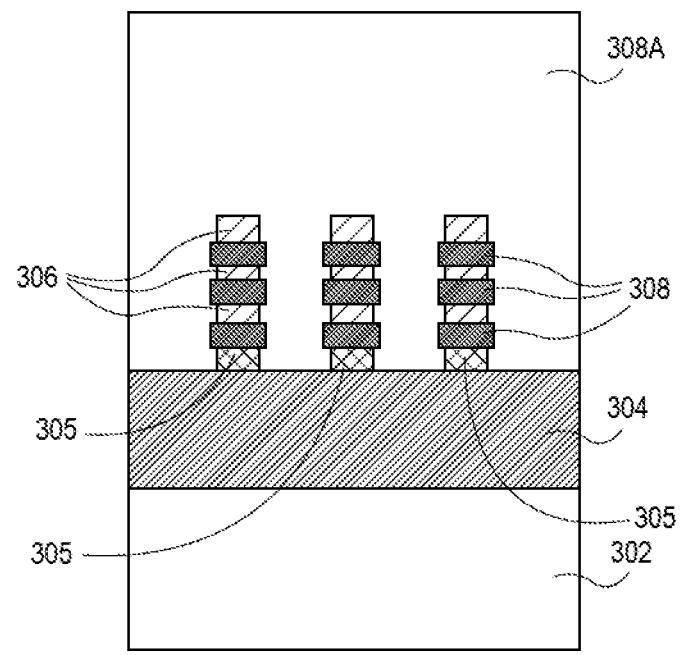

As another exemplary device having an insulator fin on an insulator substrate, FIGS. 3A and 3B illustrate a gate cut cross-sectional view and a fin cut cross-sectional view, respectively, of a gate-all-around integrated circuit structure having an insulator fin on an insulator substrate, in accordance with an embodiment of the present disclosure.

Referring to FIGS. 3A and 3B, an integrated circuit structure 300 includes an insulator fin 305 on an insulator substrate 304/302, such as a substrate having an insulator layer 304 (such as silicon oxide) on a bulk semiconductor material 302 (such as crystalline silicon). A vertical arrangement of horizontal semiconductor nanowires 306 is over the insulator fin 305. A gate stack 308/308A surrounds a channel region of the vertical arrangement of horizontal semiconductor nanowires 306. The gate stack 308/308A is also overlying the insulator fin 305 (e.g., is along a top and sides of the fin 305). Gate spacers 314 may also be included. A pair of epitaxial source or drain structures 316 is at first and second ends of the vertical arrangement of horizontal semiconductor nanowires 306 and at first and second ends of the insulator fin 305. In one embodiment, the pair of epitaxial source or drain structures 316 is formed as lower and upper portions, indicated by dashed line 399.

In an embodiment, the insulator fin 305 has a vertical thickness approximately the same as a vertical thickness of each of the horizontal semiconductor nanowires 306 of the vertical arrangement of horizontal semiconductor nanowires 306, as is depicted. In another embodiment, the insulator fin 305 has a vertical thickness greater than a vertical thickness of each of the horizontal semiconductor nanowires 306 of the vertical arrangement of horizontal semiconductor nanowires 306. In another embodiment, the insulator fin 305 has a vertical thickness less than a vertical thickness of each of the horizontal semiconductor nanowires 306 of the vertical arrangement of horizontal semiconductor nanowires 306.

In an embodiment, the insulator fin 305 includes silicon oxide, and the vertical arrangement of horizontal semiconductor nanowires 306 includes silicon. In another embodiment, the vertical arrangement of horizontal semiconductor nanowires 306 includes silicon germanium. In another embodiment, the vertical arrangement of horizontal semiconductor nanowires 306 includes a group III-V material.

In an embodiment, the insulator substrate 304/302 includes a layer 304 of silicon oxide, and the insulator fin 305 is on the layer of silicon oxide. In another embodiment, the insulator substrate 304/302 includes a layer 304 of silicon nitride, and the insulator fin 305 is on the layer of silicon nitride.

In an embodiment, a bottom of the pair of epitaxial source or drain structures 316 is on the insulator substrate 304/302, as is depicted. In one such embodiment, the bottom of the pair of epitaxial source or drain structures 316 is co-planar with a bottom of the insulator fin 305, as is depicted. In an embodiment, the pair of epitaxial source or drain structures 316 is a pair of non-discrete epitaxial source or drain structures, as is depicted, and as is described in greater detail below.

For clarity of illustration, gate stacks 308 and 308A are depicted as separate structures. However, in an embodiment, the regions 308 and 308A are continuous structures. In one such embodiment, the gate stack includes a gate electrode 312 and a gate dielectric 310. It is to be appreciated that both the gate electrode 312 and a gate dielectric 310 may be continuous around and between the insulator fin 305 and the vertical arrangement of horizontal semiconductor nanowires 306.

Figure 4:
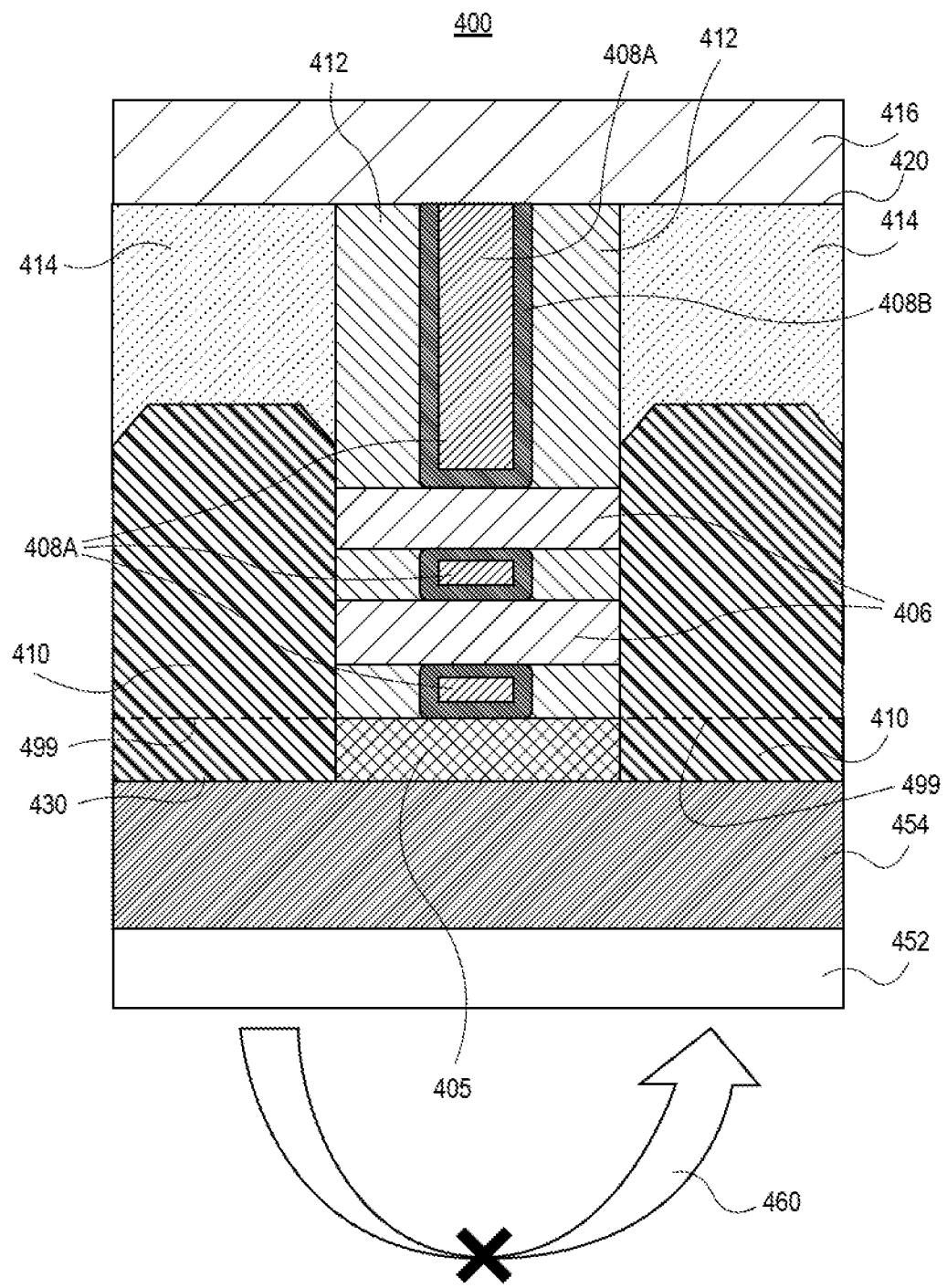
FIG. 4 illustrates a cross-sectional view of another gate-all-around integrated circuit structure having an insulator fin on an insulator substrate, in accordance with another embodiment of the present disclosure.

As another exemplary device having an insulator fin on an insulator substrate, FIG. 4 illustrates a cross-sectional view of another gate-all-around integrated circuit structure having an insulator fin on an insulator substrate, in accordance with another embodiment of the present disclosure.

Referring to FIG. 4, an integrated circuit structure 400 includes a vertical arrangement of horizontal semiconductor nanowires 406 above an insulator fin 405. A gate stack 408A/408B (with gate electrode 408A and gate dielectric 408B) surrounds a channel region of the vertical arrangement of horizontal semiconductor nanowires 406 and overlies the insulator fin 405 (e.g., is along a top and sides of the insulator fin 405, although only the former depicted in the view of FIG. 4 where side coverage by the gate stack 408A/408B along sides of the insulator fin 405 is at locations into and out of the page of the perspective of FIG. 4). A pair of non-discrete epitaxial source or drain structures 410 is at first and second ends of the vertical arrangement of horizontal semiconductor nanowires 406 and at first and second ends of the insulator fin 405. In one embodiment, the pair of epitaxial source or drain structures 410 is formed as lower and upper portions, indicated by dashed line 499.

A pair of dielectric spacers 412 is between the pair of non-discrete epitaxial source or drain structures 410 and the gate stack 408A/408B. In one embodiment, the pair of dielectric spacers 412 and the gate stack 408A/408B have co-planar top surfaces, e.g., at surface 420, as is depicted. In one such embodiment, an etch stop layer or dielectric layer 416 is formed on the surface 420. In one embodiment, the pair of dielectric spacers 412, the insulator fin 405 and the pair of non-discrete epitaxial source or drain structures 410 have co-planar bottom surfaces, e.g., at surface 430, as is depicted. The surface 430 is on an insulator substrate 454/452, such as a substrate having an insulator layer 454 (such as silicon oxide) on a bulk semiconductor material 452 (such as crystalline silicon).

In an embodiment, one or both of the pair of non-discrete epitaxial source or drain structures has a dielectric material thereon (represented by 414 in one embodiment). In one such embodiment, wherein the dielectric material 414, the pair of dielectric spacers 412 and the gate stack 408A/408B have co-planar top surfaces, as is depicted at surface 420. In an embodiment, one or both of the pair of non-discrete epitaxial source or drain structures has a top conductive contact thereon (represented by 414 in another embodiment). In one such embodiment, wherein the top conductive contact 414, the pair of dielectric spacers 412 and the gate stack 408A/408B have co-planar top surfaces, as is depicted at surface 420. In an embodiment, insulator fin 405 blocks or eliminates a parasitic conduction path (e.g., path 460 from Source 410 to Drain 410) for improved device performance.

In accordance with an embodiment of the present disclosure, with reference again to FIG. 4, a method of fabricating an integrated circuit structure 400 includes forming a vertical arrangement of horizontal semiconductor nanowires 406 above an insulator fin 405 above a semiconductor substrate (not shown). A gate stack 408A/408B is then formed, the gate stack 408A/408B surrounding a channel region of the vertical arrangement of horizontal semiconductor nanowires 406, and the gate stack 408A/408B overlying the insulator fin 405. A pair of epitaxial source or drain structures 410 is formed at first and second ends of the vertical arrangement of horizontal semiconductor nanowires 406 and at first and second ends of the insulator fin 405. The semiconductor substrate is removed to expose a bottom of the insulator fin 405 and a bottom of the epitaxial source or drain structures 410. An insulator substrate 454/452 is bonded to the bottom of the insulator fin 405 and to the bottom of the epitaxial source or drain structures 410.

It is to be appreciated that, in a particular embodiment, channel layers of nanowires (or nanoribbons) and initial (pre-oxidation) underlying fins or subfins may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, release layers between channel layers of nanowires (or nanoribbons) and underlying fins or subfins may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

It is to be appreciated that the embodiments described herein can also include other implementations such as nanowires and/or nanoribbons with various widths, thicknesses and/or materials including but not limited to Si, Ge, SiGe and/or Group III-V materials. Described below are various devices and processing schemes that may be used to fabricate a device with an insulator fin on an insulator substrate. It is to be appreciated that the exemplary embodiments need not necessarily require all features described, or may include more features than are described.

Figure 5:
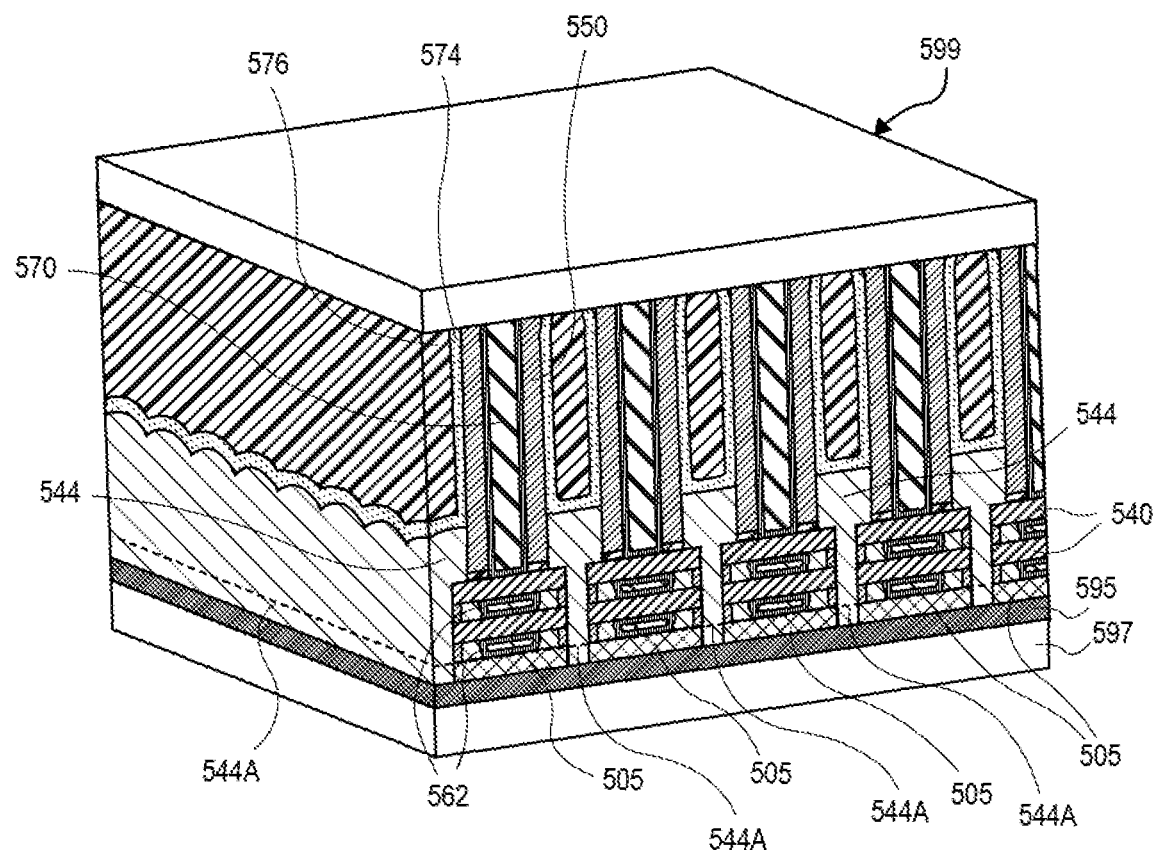
FIG. 5 illustrates an angled cross-sectional view of another gate-all-around integrated circuit structure having an insulator fin on an insulator substrate, in accordance with another embodiment of the present disclosure.

As another exemplary device having an insulator fin on an insulator substrate, FIG. 5 illustrates an angled cross-sectional view of another gate-all-around integrated circuit structure having an insulator fin on an insulator substrate, in accordance with another embodiment of the present disclosure.

Referring to FIG. 5, an integrated circuit structure includes a plurality of insulator fins 505 on an insulator substrate 595/597, such as a substrate having an insulator layer 595 (such as silicon oxide) on a bulk semiconductor material 597 (such as crystalline silicon). A corresponding vertical arrangement of horizontal semiconductor nanowires 540 is over each of the plurality of insulator fins 505. A corresponding gate stack surrounds a channel region of each of the vertical arrangements of horizontal semiconductor nanowires 540. The gate stack can include a gate electrode 570 and a gate dielectric 562. Each gate stack is also overlying a corresponding insulator fin 505. A gate spacer 550 is on either side of the gate stack. Epitaxial source or drain structures 544 is at first and second ends of each of the vertical arrangement of horizontal semiconductor nanowires 540 and at first and second ends of the insulator fins 505. In one embodiment, the epitaxial source or drain structures 544 are formed as lower and upper portions, indicated by dashed line 544A. An etch stop layer 599 may be formed over the epitaxial source or drain structures 544 and the gate stacks, as is depicted.

In another aspect, integrated circuit structures described herein may be fabricated using a back-side reveal of front-side structures fabrication approach. In some exemplary embodiments, reveal of the back-side of a transistor or other device structure entails wafer-level back-side processing. A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadruple mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate:intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing. In accordance with one or more embodiments of the present disclosure, following a backside reveal process an insulator substrate, such as a substrate having an insulator layer (such as silicon oxide) on a bulk semiconductor material (such as crystalline silicon) is bonded to exposed bottom surfaces of the bottommost wires (fins) and to exposed bottom surfaces of epitaxial source or drain structures.

It is to be appreciated that the structures resulting from the above exemplary processing schemes may be used in a same or similar form for subsequent processing operations to complete device fabrication, such as PMOS and/or NMOS device fabrication. As an example of a possible completed device, and as another exemplary device having an insulator fin on an insulator substrate, FIG. 6 illustrates a cross-sectional views of a non-planar integrated circuit structure as taken along a gate line, in accordance with an embodiment of the present disclosure.

Figure 6:
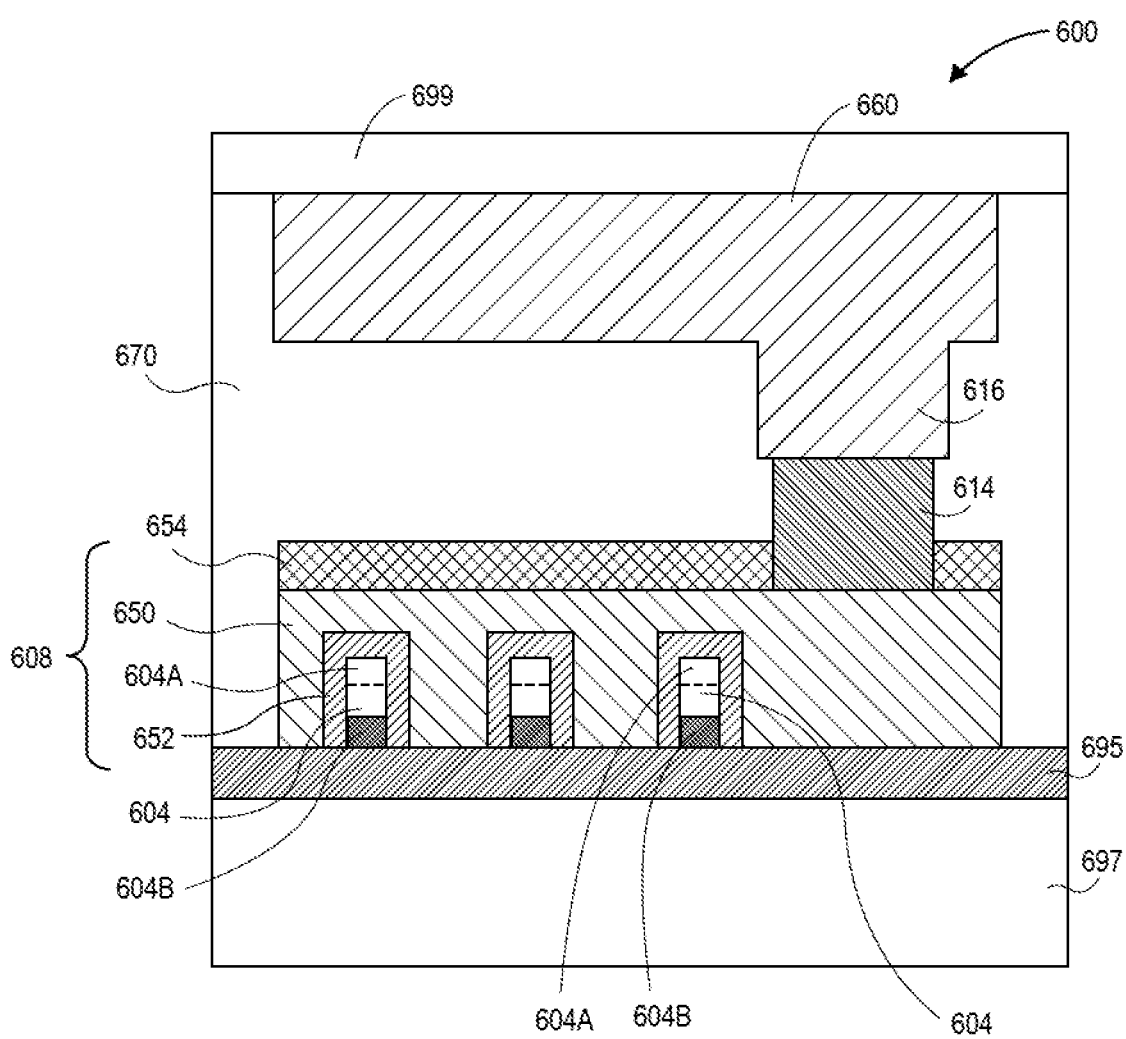
FIG. 6 illustrates a cross-sectional views of a non-planar integrated circuit structure as taken along a gate line, in accordance with an embodiment of the present disclosure.

Referring to FIG. 6, a semiconductor structure or device 600 includes a non-planar active region (e.g., a fin structure including protruding fin portion 604) on a dielectric layer 695 of an insulator substrate 697/695. In an embodiment, instead of a solid fin, the non-planar active region is separated between regions 604A and 604B to provide a semiconductor nanowire 604A and an insulator fin 604B (e.g., oxidized semiconductor fin) with the gate structure 608 there between. In either case, for ease of description for non-planar integrated circuit structure 600, a non-planar active region 604 is referenced below as a protruding fin portion.

A gate line 608 is disposed over the protruding portions 604 of the non-planar active region (including, if applicable, surrounding nanowire 604A and insulator fin 604B), as well as over a portion of the dielectric layer 695. As shown, gate line 608 includes a gate electrode 650 and a gate dielectric layer 652. In one embodiment, gate line 608 may also include a dielectric cap layer 654. A gate contact 614, and overlying gate contact via 616 are also seen from this perspective, along with an overlying metal interconnect 660, all of which are disposed in inter-layer dielectric stacks or layers 670. An etch stop layer 699 may be formed on the interconnect 660 and inter-layer dielectric stacks or layers 670, as is depicted. Also seen from the perspective of FIG. 6, the gate contact 614 is, in one embodiment, disposed over dielectric layer 695, but not over the non-planar active regions. In another embodiment, however, the gate contact 614 is over the non-planar active regions.

In an embodiment, the semiconductor structure or device 600 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 608 surround at least a top surface and a pair of sidewalls of the three-dimensional body.

Although not depicted in FIG. 6, it is to be appreciated that source or drain regions of or adjacent to the protruding fin portions 604 are on either side of the gate line 608, i.e., into and out of the page. In one embodiment, the material of the protruding fin portions 604 in the source or drain locations is removed and replaced with another semiconductor material, e.g., by epitaxial deposition to form epitaxial source or drain structures. The source or drain regions may extend to the top surface of the dielectric layer 695. In accordance with an embodiment of the present disclosure, the insulator fin 604B inhibits source to drain leakage.

With reference again to FIG. 6, in an embodiment, nanowires 604A are composed of crystalline silicon layer which may be doped with a charge carrier, such as but not limited to phosphorus, arsenic, boron, gallium or a combination thereof. In an embodiment, insulator fin 604B is composed of a dielectric material such as, but not limited to, silicon dioxide, silicon oxy-nitride, silicon nitride, or carbon-doped silicon nitride.

Gate line 608 may be composed of a gate electrode stack which includes a gate dielectric layer 652 and a gate electrode layer 650. In an embodiment, the gate electrode layer 650 of the gate electrode stack is composed of a metal gate and the gate dielectric layer is composed of a high-k material. For example, in one embodiment, the gate dielectric layer 652 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 652 may include a layer of native oxide formed from the top few layers of the nanowires 604A. In an embodiment, the gate dielectric layer 652 is composed of a top high-k portion and a lower portion composed of an oxide of a semiconductor material. In one embodiment, the gate dielectric layer 652 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer 650 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 650 is composed of a non-workfunction-setting fill material formed above a metal workfunction-setting layer. The gate electrode layer 650 may consist of a P-type workfunction metal or an N-type workfunction metal, depending on whether the transistor is to be a PMOS or an NMOS transistor. In some implementations, the gate electrode layer 650 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode layer 650 may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 614 and overlying gate contact via 616 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 608 is formed while eliminating the use of a lithographic step with exceedingly tight registration budget. In an embodiment, the contact pattern is a vertically symmetric contact pattern, or an asymmetric contact pattern. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 600 involves fabrication of the gate stack structure 608 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 6, the arrangement of semiconductor structure or device 600 places the gate contact over isolation regions. Such an arrangement may be viewed as inefficient use of layout space. In another embodiment, however, a semiconductor device has contact structures that contact portions of a gate electrode formed over an active region, e.g., over a nanowire 604A, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

To provide further context, advantages of a self-aligned gate endcap (SAGE) architecture may include the enabling of higher layout density and, in particular, scaling of diffusion to diffusion spacing. To provide illustrative comparison, FIG. 7 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 7:
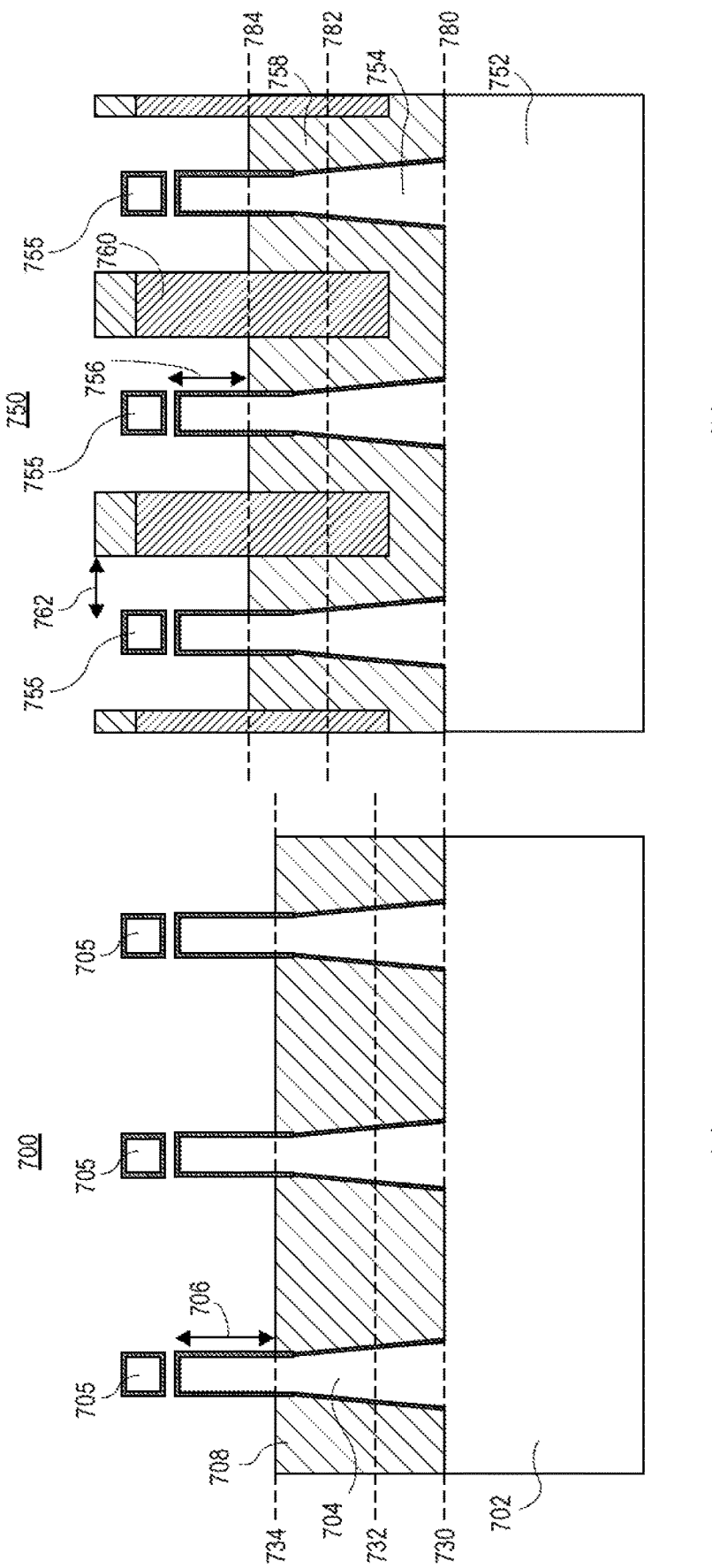
FIG. 7 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 7, an integrated circuit structure 700 includes a substrate 702 having fins 704 protruding there from by an amount 706 above an isolation structure 708 laterally surrounding lower portions of the fins 704. Corresponding nanowires 705 are over the fins 704. A gate structure may be formed over the integrated circuit structure 700 to fabricate a device. However, breaks in such a gate structure may be accommodated for by increasing the spacing between fin 704/nanowire 705 pairs.

Referring again to part (a) of FIG. 7, in an embodiment, during a replacement gate process, the exposed portions of fins 704 are oxidized to form insulator fins beneath the nanowires 705. Oxidation may be only for the exposed portion (i.e., to level 734) but could also extend into the fin (i.e., to level 732) or all the way through the fin (i.e., to level 730), effectively providing an insulator fin on a bulk substrate (as opposed to on an insulator substrate as described above).

By contrast, referring to the right-hand side (b) of FIG. 7, an integrated circuit structure 750 includes a substrate 752 having fins 754 protruding therefrom by an amount 756 above an isolation structure 758 laterally surrounding lower portions of the fins 754. Corresponding nanowires 755 are over the fins 754. Isolating SAGE walls 760 (which may include a hardmask thereon, as depicted) are included within the isolation structure 752 and between adjacent fin 754/nanowire 755 pairs. The distance between an isolating SAGE wall 760 and a nearest fin 754/nanowire 755 pair defines the gate endcap spacing 762. A gate structure may be formed over the integrated circuit structure 750, between insolating SAGE walls to fabricate a device. Breaks in such a gate structure are imposed by the isolating SAGE walls. Since the isolating SAGE walls 760 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 760. In an embodiment, as depicted, the SAGE walls 760 each include a lower dielectric portion and a dielectric cap on the lower dielectric portion.

Referring again to part (b) of FIG. 7, in an embodiment, during a replacement gate process, the exposed portions of fins 754 are oxidized to form insulator fins beneath the nanowires 755. Oxidation may be only for the exposed portion (i.e., to level 784) but could also extend into the fin (i.e., to level 782) or all the way through the fin (i.e., to level 780), effectively providing an insulator fin on a bulk substrate (as opposed to on an insulator substrate as described above).

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an embodiment, as described throughout, self-aligned gate endcap (SAGE) isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

To highlight an exemplary integrated circuit structure having two vertically arranged nanowires over an insulator fin, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. In an embodiment, as depicted, an insulator layer 802B and a bulk semiconductor layer 802A are included in substrate 802, as is depicted. Embodiments herein are targeted at both single wire devices and multiple wire devices. As an example, a two nanowire-based devices having nanowires 804B and 804C is shown for illustrative purposes. For convenience of description, nanowire 804B is used as an example where description is focused on one of the nanowires. It is to be appreciated that where attributes of one nanowire are described, embodiments based on a plurality of nanowires may have the same or essentially the same attributes for each of the nanowires. In either case, the one nanowire or the plurality of nanowires is over an insulator fin 899 (which may be an oxidized nanowire 804A).

Each of the nanowires 804B and 804C includes a channel region 806 in the nanowire. The channel region 806 has a length (L). The channel region also has a perimeter orthogonal to the length (L). Referring to both FIGS. 8A and 8C, a gate electrode stack 808 surrounds the entire perimeter of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. That is, the non-discrete source or drain regions 810/812 are global in the sense that a single unified feature is used as a source or drain region for a plurality (in this case, 3) of nanowires 804 and, more particularly, for more than one discrete channel region 806. In one embodiment, from a cross-sectional perspective orthogonal to the length of the discrete channel regions 806, each of the pair of non-discrete source or drain regions 810/812 is approximately rectangular in shape with top vertex portion, as depicted in FIG. 8B. In other embodiments, however, the source or drain regions 810/812 of the nanowires are relatively larger yet discrete non-vertically merged epitaxial structures such as nubs.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

In an embodiment, the nanowires 804B and 804C may be sized as wires or ribbons, as described below, and may have squared-off or rounder corners. In an embodiment, the nanowires 804B and 804C are composed of a material such as, but not limited to, silicon, germanium, or a combination thereof. In one such embodiment, the nanowires are single-crystalline. For example, for a silicon nanowire, a single-crystalline nanowire may be based from a (100) global orientation, e.g., with a <100> plane in the z-direction. As described below, other orientations may also be considered. In an embodiment, the dimensions of the nanowires, from a cross-sectional perspective, are on the nano-scale. For example, in a specific embodiment, the smallest dimension of the nanowire is less than approximately 20 nanometers. In an embodiment, the nanowires are composed of a strained material, particularly in the channel regions 806.

Referring to FIG. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbons as described throughout.

In an embodiment, as described throughout, an integrated circuit structure effectively includes an oxidized non-planar device such as, but not limited to, an oxidized finFET or an oxidized tri-gate device, with corresponding one or more overlying nanowire structures. In one embodiment, a gate structure surrounds each of the one or more discrete nanowire channel portions and, possibly, a portion of the oxidized finFET or the oxidized tri-gate device.

In an embodiment, as described throughout, an underlying semiconductor substrate (which can ultimately be removed and replaced with an insulator substrate or an insulator on semiconductor substrate, or which is already beneath an overlying insulator layer) may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron, gallium or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
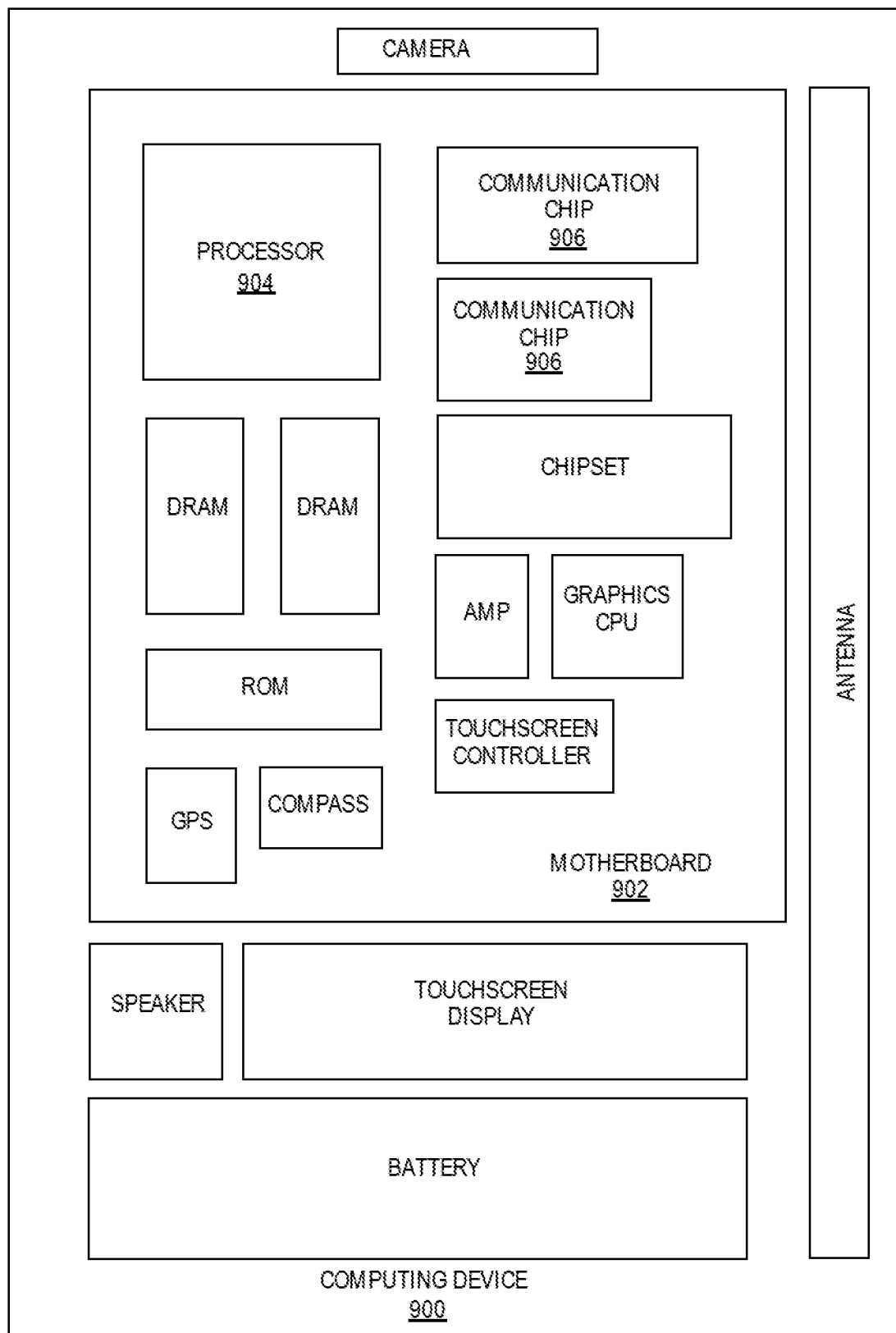
FIG. 9 illustrates a computing device in accordance with one implementation of an embodiment of the disclosure.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as gate-all-around integrated circuit structures having an insulator fin on an insulator substrate, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as gate-all-around integrated circuit structures having an insulator fin on an insulator substrate, built in accordance with implementations of embodiments of the present disclosure.

In further implementations, another component housed within the computing device 900 may contain an integrated circuit die that includes one or structures, such as gate-all-around integrated circuit structures having an insulator fin on an insulator substrate, built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
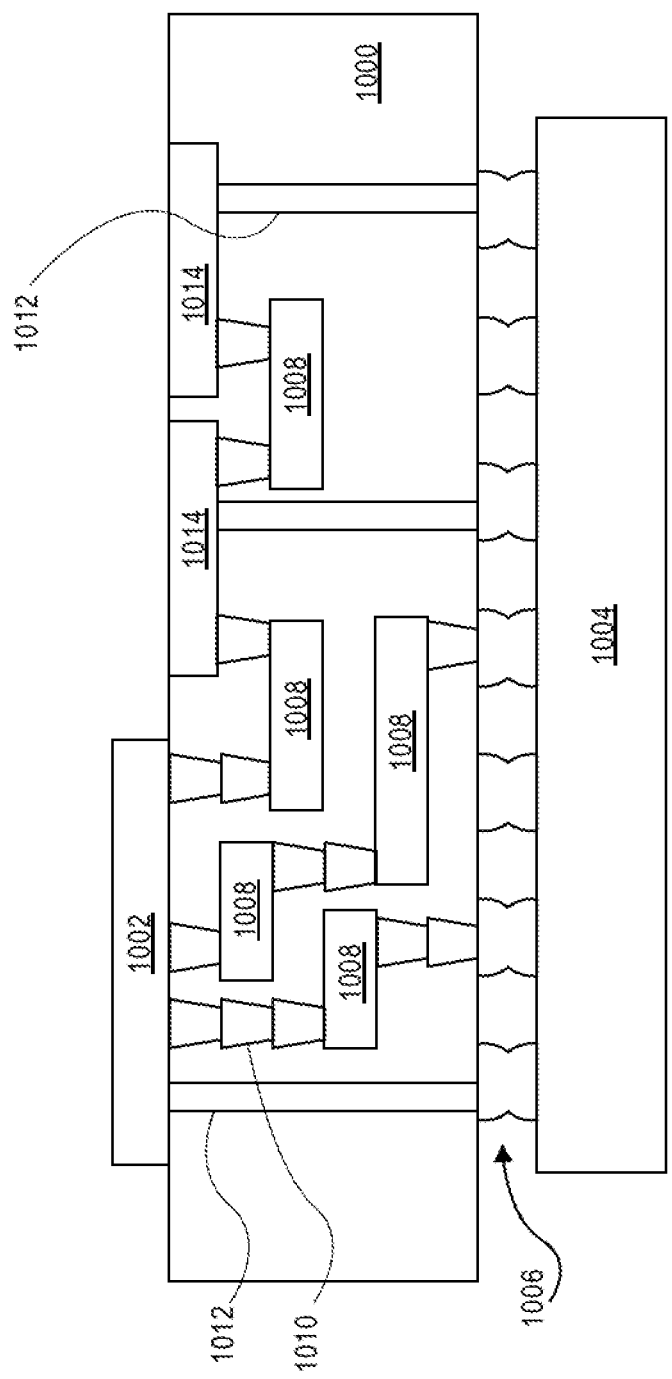
FIG. 10 illustrates an interposer that includes one or more embodiments of the disclosure.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Thus, embodiments of the present disclosure include gate-all-around integrated circuit structures having an insulator fin on an insulator substrate, and methods of fabricating gate-all-around integrated circuit structures having an insulator fin on an insulator substrate.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes an insulator fin on an insulator substrate. A vertical arrangement of horizontal semiconductor nanowires is over the insulator fin. A gate stack surrounds a channel region of the vertical arrangement of horizontal semiconductor nanowires, and the gate stack is overlying the insulator fin. A pair of epitaxial source or drain structures is at first and second ends of the vertical arrangement of horizontal semiconductor nanowires and at first and second ends of the insulator fin.

Example embodiment 2: The integrated circuit structure of example embodiment 1, wherein the insulator fin has a vertical thickness approximately the same as a vertical thickness of each of the nanowires of the vertical arrangement of horizontal semiconductor nanowires.

Example embodiment 3: The integrated circuit structure of example embodiment 1, wherein the insulator fin has a vertical thickness greater than a vertical thickness of each of the nanowires of the vertical arrangement of horizontal semiconductor nanowires.

Example embodiment 4: The integrated circuit structure of example embodiment 1, wherein the insulator fin has a vertical thickness less than a vertical thickness of each of the nanowires of the vertical arrangement of horizontal semiconductor nanowires.

Example embodiment 5: The integrated circuit structure of example embodiment 1, 2, 3 or 4, wherein the insulator fin includes silicon oxide, and the vertical arrangement of horizontal semiconductor nanowires includes silicon.

Example embodiment 6: The integrated circuit structure of example embodiment 1, 2, 3 or 4, wherein the vertical arrangement of horizontal semiconductor nanowires includes silicon germanium or a group III-V material.

Example embodiment 7: The integrated circuit structure of example embodiment 1, 2, 3, 4, 5 or 6, wherein the insulator substrate includes a layer of silicon oxide, and the insulator fin is on the layer of silicon oxide.

Example embodiment 8: The integrated circuit structure of example embodiment 1, 2, 3, 4, 5 or 6, wherein the insulator substrate includes a layer of silicon nitride, and the insulator fin is on the layer of silicon nitride.

Example embodiment 9: The integrated circuit structure of example embodiment 1, 2, 3, 4, 5, 6, 7 or 8, wherein a bottom of the pair of epitaxial source or drain structures is on the insulator substrate.

Example embodiment 10: The integrated circuit structure of example embodiment 9, wherein the bottom of the pair of epitaxial source or drain structures is co-planar with a bottom of the insulator fin.

Example embodiment 11: The integrated circuit structure of example embodiment 1, 2, 3, 4, 5, 6, 7, 8, 9 or 10, wherein the insulator substrate includes a remnant catalyst material beneath the insulator fin.

Example embodiment 12: The integrated circuit structure of example embodiment 1, 2, 3, 4, 5, 6, 7, 8, 9, 10 or 11, wherein the pair of epitaxial source or drain structures is a pair of non-discrete epitaxial source or drain structures.

Example embodiment 13: The integrated circuit structure of example embodiment 1, 2, 3, 4, 5, 6, 7, 8, 9, 10, 11 or 12, wherein the gate stack includes a high-k gate dielectric layer and a metal gate electrode.

Example embodiment 14: A method of fabricating an integrated circuit structure includes forming a vertical arrangement of horizontal semiconductor nanowires above a semiconductor fin above an insulator substrate. A dummy gate stack is then formed, the dummy gate stack surrounding a channel region of the vertical arrangement of horizontal semiconductor nanowires, and the dummy gate stack overlying the semiconductor fin. A pair of epitaxial source or drain structures is formed at first and second ends of the vertical arrangement of horizontal semiconductor nanowires and at first and second ends of the semiconductor fin. The dummy gate stack is then removed. The semiconductor fin is then oxidized to form an insulator fin. A permanent gate stack is then formed, the permanent gate stack surrounding the channel region of the vertical arrangement of horizontal semiconductor nanowires, and the permanent gate stack overlying the insulator fin.

Example embodiment 15: The method of example embodiment 14, wherein forming the pair of epitaxial source or drain structures includes forming a non-discrete pair of epitaxial source or drain structures.

Example embodiment 16: A computing device includes a board, and a component coupled to the board. The component includes an integrated circuit structure including an insulator fin on an insulator substrate. A vertical arrangement of horizontal semiconductor nanowires is over the insulator fin. A gate stack surrounds a channel region of the vertical arrangement of horizontal semiconductor nanowires, and the gate stack is overlying the insulator fin. A pair of epitaxial source or drain structures is at first and second ends of the vertical arrangement of horizontal semiconductor nanowires and at first and second ends of the insulator fin.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:
   an insulator fin directly on an insulator layer of an insulator substrate;
   a vertical arrangement of horizontal semiconductor nanowires over the insulator fin;
   a gate stack surrounding a channel region of the vertical arrangement of horizontal semiconductor nanowires, and the gate stack overlying the insulator fin; and
   a pair of epitaxial source or drain structures at first and second ends of the vertical arrangement of horizontal semiconductor nanowires and laterally adjacent to and in contact with first and second ends of the insulator fin.

2. The integrated circuit structure of claim 1, wherein the insulator fin has a vertical thickness approximately the same as a vertical thickness of each of the nanowires of the vertical arrangement of horizontal semiconductor nanowires.

3. The integrated circuit structure of claim 1, wherein the insulator fin has a vertical thickness greater than a vertical thickness of each of the nanowires of the vertical arrangement of horizontal semiconductor nanowires.

4. The integrated circuit structure of claim 1, wherein the insulator fin has a vertical thickness less than a vertical thickness of each of the nanowires of the vertical arrangement of horizontal semiconductor nanowires.

5. The integrated circuit structure of claim 1, wherein the insulator fin comprises silicon oxide, and the vertical arrangement of horizontal semiconductor nanowires comprises silicon.

6. The integrated circuit structure of claim 1, wherein the vertical arrangement of horizontal semiconductor nanowires comprises silicon germanium or a group III-V material.

7. The integrated circuit structure of claim 1, wherein the insulator substrate comprises a layer of silicon oxide, and the insulator fin is on the layer of silicon oxide.

8. The integrated circuit structure of claim 1, wherein the insulator substrate comprises a layer of silicon nitride, and the insulator fin is on the layer of silicon nitride.

9. The integrated circuit structure of claim 1, wherein a bottom of the pair of epitaxial source or drain structures is on the insulator substrate.

10. The integrated circuit structure of claim 9, wherein the bottom of the pair of epitaxial source or drain structures is co-planar with a bottom of the insulator fin.

11. The integrated circuit structure of claim 1, wherein the insulator substrate comprises a remnant catalyst material beneath the insulator fin.

12. The integrated circuit structure of claim 1, wherein the pair of epitaxial source or drain structures is a pair of non-discrete epitaxial source or drain structures.

13. The integrated circuit structure of claim 1, wherein the gate stack comprises a high-k gate dielectric layer and a metal gate electrode.

14. A method of fabricating an integrated circuit structure, the method comprising:
    forming a vertical arrangement of horizontal semiconductor nanowires above a semiconductor fin above an insulator substrate;
    forming a dummy gate stack surrounding a channel region of the vertical arrangement of horizontal semiconductor nanowires, the dummy gate stack overlying the semiconductor fin;
    forming a pair of epitaxial source or drain structures at first and second ends of the vertical arrangement of horizontal semiconductor nanowires and laterally adjacent to first and second ends of the semiconductor fin;
    removing the dummy gate stack;
    oxidizing the semiconductor fin to form an insulator fin, the insulator fin directly on an insulator layer of the insulator substrate; and
    forming a permanent gate stack surrounding the channel region of the vertical arrangement of horizontal semiconductor nanowires, the permanent gate stack overlying the insulator fin.

15. The method of claim 14, wherein forming the pair of epitaxial source or drain structures comprises forming a non-discrete pair of epitaxial source or drain structures.

16. A computing device, comprising:
    a board; and
    a component coupled to the board, the component including an integrated circuit structure, comprising:
       an insulator fin directly on an insulator layer of an insulator substrate;
       a vertical arrangement of horizontal semiconductor nanowires over the insulator fin;
       a gate stack surrounding a channel region of the vertical arrangement of horizontal semiconductor nanowires, and the gate stack overlying the insulator fin; and
       a pair of epitaxial source or drain structures at first and second ends of the vertical arrangement of horizontal semiconductor nanowires and laterally adjacent to and in contact with first and second ends of the insulator fin.

17. The computing device of claim 16, further comprising:
    a memory coupled to the board.

18. The computing device of claim 16, further comprising:
    a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *